(12) United States Patent
Schulze et al.

(10) Patent No.: US 8,895,453 B2
(45) Date of Patent: Nov. 25, 2014

(54) SEMICONDUCTOR DEVICE WITH AN INSULATION LAYER HAVING A VARYING THICKNESS

(71) Applicant: Infineon Technologies AG, Neubiberg (DE)

(72) Inventors: Hans-Joachim Schulze, Taufkirchen (DE); Johannes Laven, Taufkirchen (DE); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/861,496

(22) Filed: Apr. 12, 2013

(65) Prior Publication Data
US 2014/0306347 A1    Oct. 16, 2014

(51) Int. Cl.
*H01L 21/308* (2006.01)
(52) U.S. Cl.
USPC ..... 438/725; 438/736; 438/942; 257/E21.235
(58) Field of Classification Search
USPC .................. 438/725, 736, 942; 257/E21.235
See application file for complete search history.

(56) References Cited

U.S. PATENT DOCUMENTS

| | | | |
|---|---|---|---|
| 7,651,950 B2* | 1/2010 | Ban | 438/725 |
| 8,143,171 B2* | 3/2012 | Mashita et al. | 438/736 |
| 8,314,034 B2* | 11/2012 | Tan et al. | 438/717 |
| 2004/0021221 A1* | 2/2004 | Lee et al. | 257/758 |
| 2007/0148984 A1* | 6/2007 | Abatchev et al. | 438/725 |
| 2009/0170316 A1* | 7/2009 | Tan et al. | 438/689 |

OTHER PUBLICATIONS

Brieger, K.P. et al. "The Contour of an Optimal Field Plate—An Analytical Approach." IEEE Transactions on Electron Devices, May 1988, pp. 684-688, vol. 35, No. 5.
Fang, X. et al. "A New Embedded Inductor for ZVS DC-DC Converter Applications." Proceedings of the 2012 24th International Symposium on Power Semiconductor Devices and ICs, Jun. 3-7, 2012, pp. 53-56, Bruges, Belgium.

* cited by examiner

*Primary Examiner* — Thanh Nguyen
(74) *Attorney, Agent, or Firm* — Murphy, Bilak & Homiller, PLLC (57) ABSTRACT

A layer with a laterally varying thickness, a substrate with a first surface and an insulation layer formed on the first surface of the substrate is provided. A plurality of at least one of recesses and openings is formed in the insulation layer, wherein the plurality is arranged at a pitch. Each of the at least one of recesses and openings has a lateral width, wherein at least one of the pitch and the lateral width varies in a lateral direction. The plurality of the at least one of recesses and openings defines a given region in the insulation layer. The insulation layer having the plurality of the at least one of the recesses and openings is tempered at elevated temperatures so that the insulation layer at least partially diffluences to provide the insulation layer with a laterally varying thickness at least in the given region.

23 Claims, 8 Drawing Sheets

SEMICONDUCTOR DEVICE WITH AN INSULATION LAYER HAVING A VARYING THICKNESS

TECHNICAL FIELD

Embodiments described herein relate to semiconductor devices and methods for manufacturing semiconductor devices.

BACKGROUND

Semiconductor devices such as power semiconductor devices include an edge termination structure for high voltage relief at the lateral periphery of the semiconductor device. Minimizing the space needed by edge termination while maintaining the blocking capabilities of the device is an important consideration. In addition, edge termination structures should minimize the influence of surface charges and external electrical fields.

Commonly known edge termination structures employ different measures such as field rings, so-called laterally varying doping, trench structures, and edge structures of the wafer with positive or negative grinding angle. A measure providing a high ruggedness against surface charges and external electrical fields employs so-called field-plates that can also be combined with other measures. The field-plates cause a deformation and spreading of the electrical field lines in the region of curved pn-junctions to reduce the electrical field. However, due to the manufacturing processes used, field-plates have sharp edges that cause field peaks in the semiconductor material and in the dielectric layer arranged between the field-plate and the semiconductor material.

Field peaks caused by the sharp edges of the field-plates can in principle be avoided by optimizing the shape of the field-plates. However, such optimized field-plate geometry is difficult to manufacture. Therefore, field-plates with multiple steps are commonly used that partially reduce the field strength but do not completely avoid the field peaks in the dielectric layer underneath the field-plates. As a result, long term problems still remain. Furthermore, multiple photolithographic steps are needed for manufacturing field-plates with multiple steps.

Another commonly used approach is etching abrupt or steep edges by anisotropic etching. This approach is limited to the formation of flank angles larger than 10°. Furthermore, only thin oxide layers can be processed so that the range of use of this approach is limited.

In view of the above, there is a need for improvement.

SUMMARY

According to an embodiment, a method for manufacturing a layer with a laterally varying thickness is provided. The method includes providing a substrate with a first surface and an insulation layer formed on the first surface of the substrate and forming a plurality of at least one of recesses and openings in the insulation layer, the plurality of the at least one of recesses and openings arranged at a pitch and each of the at least one of recesses and openings having a lateral width. At least one of the pitch and the lateral width varies in a lateral direction. The plurality of the at least one of recesses and openings defines a given region in the insulation layer. The method further includes tempering the insulation layer having the plurality of the at least one of the recesses and openings at elevated temperatures so that the insulation layer at least partially diffluences to provide the insulation layer with a laterally varying thickness at least in the given region.

According to another embodiment, a method of manufacturing a semiconductor device is provided. The method includes providing a semiconductor substrate with a first surface, forming an insulation layer on the first surface of the semiconductor substrate and forming a plurality of at least one of recesses and openings in the insulation layer. The plurality of the at least one of the recesses and openings are arranged at a pitch and each of the at least one of the recesses and openings having a lateral width, wherein at least one of the pitch and the lateral width varies in lateral direction, and wherein the plurality of the at least one of the recesses and openings defines a given region of the insulation layer. The method further includes tempering the insulation layer having the plurality of the at least one of the recesses and openings at an elevated temperature so that the insulation layer diffluences to provide the insulation layer with a laterally increasing thickness at least in the given region and forming a metal layer on the tempered insulation layer.

According to another embodiment, a method of manufacturing a semiconductor device is provided. The method includes providing a semiconductor substrate with a first surface and an insulation layer on the first surface of the semiconductor substrate and forming a plurality of at least one of recesses and openings in the insulation layer in a given region. The plurality of the at least one of the recesses and openings are arranged at a pitch and each of the at least one of the recesses and openings has a lateral width, wherein at least one of the pitch and the lateral width varies in a lateral direction in the given region. The method further includes tempering the insulation layer having the plurality of the at least one of the recesses and openings at elevated temperature so that the insulation layer diffluences to provide the insulation layer with a laterally varying thickness in the given region. The method further includes etching the insulation layer having the laterally increasing thickness and the semiconductor substrate in a common etching process to remove the insulation layer at least in the given region and to provide the semiconductor substrate with a laterally varying thickness at least in the given region.

According to another embodiment, a semiconductor device includes a semiconductor substrate having a first surface, an insulation layer having a laterally varying thickness on the first surface, and a metal layer on the first surface, wherein the insulation layer has ripples in its surface facing the metal layer.

According to another embodiment, a semiconductor device includes a semiconductor substrate having a first surface and at least one of a laterally varying thickness and an inclined first surface, wherein the first surface of the semiconductor substrate comprises ripples.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead the figures illustrate the principles of the invention according to various embodiments. Moreover, in the figures, like reference numerals designate corresponding parts.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments described use specific language that should not be construed as limiting the scope of the appended claims.

The term "lateral" as used in this specification intends to describe an orientation parallel to the main surface of a semiconductor substrate.

The term "vertical" as used in this specification intends to describe an orientation that is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

The term "diffluence" may be used herein as either a verb or a noun. When used as a verb, the term "diffluence" should be understood to mean, depending on its context, either "flowing, or partially reflowing, in a spreading manner, for example as a result of at least partial liquefaction that results in a decreased viscosity" or "causing to flow, or partially reflow, in a spreading manner, for example as a result of at least partial liquefaction that results in a decreased viscosity." As described in further detail herein, diffluence of an insulation layer material may be achieved by increasing the temperature of the material to reduce its viscosity. In the particular examples described herein, this reduction is not a melting in the sense of a phase transition, but is a more general softening of the material that permits a spreading action.

An embodiment is described next with reference to FIGS. 1A to 1D. This embodiment includes formation of an insulation layer having a lateral varying thickness. In particular, the insulation layer such as an oxide layer is provided with a substantially continuously increasing thickness in lateral direction.

A substrate 110 such as a semiconductor substrate is provided. The substrate 110 includes a first surface 111 and a second surface 112 opposite to the first surface. An insulation layer 120 is formed on the first surface 111 of the substrate 110. A plurality of at least one of recesses and openings 125 is formed in the insulation layer 120. FIG. 1B shows the insulation layer 120 provided with a plurality of openings 125. Alternatively, recesses of different depth can be provided that are also suitable for the subsequent processes.

The insulation layer 120 can be a single layer made of silicon oxide, for example. Any insulating material that is capable of being softened by a tempering process can be used, as described further below. Specific examples of suitable materials include doped oxide layers, such as phosphorous glass. In addition or alternatively, boron-doped phosphorous glass, polymers, and/or resist can be used. Furthermore, combinations of the materials further allow tailoring the flow properties of the insulation layer 120.

The insulation layer 120 can also include a stack of at least two or multiple layers. For example, two or more oxide layers having a different etching rate can be formed on the first surface 111 of the substrate 110. The different etching rate is defined with respect to a common single etching process. The layer stack including layers of different etching rate may be formed by sequentially depositing layers of different etching rate. Typically, a layer with a low etching rate is first deposited, followed by the deposition of one or more layers having a higher etching rate. Alternatively, layers having different etching rates can be formed by depositing a base material and then implanting impurities that influence the etching rate of the base material. Such an implantation process can be described as damage implantation as the implanted ions damage the base material and increase the susceptibility of the base material against the etching process. Hence, the etching rate increases by implanting ions.

The openings 125 are arranged at a pitch p. Each of the openings 125 has a lateral width w as illustrated in FIG. 1B. At least one of the pitch p and the lateral width w varies in a lateral direction. The pitch p is defined to be the lateral distance between the center lines of the openings 125. The dashed lines in FIG. 1B indicate the center lines of the openings 125.

According to an embodiment, the pitch p of the plurality of the at least one of the recesses and openings 125 increases in the lateral direction while the lateral width w of each of the at least one of the recesses and openings 125 remains constant.

According to an embodiment, the lateral width w of each of the at least one of the recesses and openings 125 decreases in the lateral direction while the pitch p of the plurality of the at least one of the recesses and openings 125 remains constant.

According to an embodiment, the lateral width w of each of the at least one of the recesses and openings 125 decreases in the lateral direction while the pitch p of the plurality of the at least one of the recesses and openings 125 increases in the lateral direction.

Typically, the plurality of openings 125 includes more than two openings such as at least three openings or at least five openings, and ideally includes at least ten openings, or more. The number of openings depends on the available space and the extent to which the lateral width w and/or the pitch vary.

The plurality of the openings 125 defines a given region in the insulation layer 120. According to the embodiment depicted in FIG. 1B, the given region includes seven openings 125. The given region defines the region where the insulation layer 120 will be provided with a lateral varying thickness. In the present embodiment, the insulation layer 120 will be provided with a laterally increasing thickness from left to right.

In the embodiment shown in FIGS. 1A to 1D, the pitch p remains constant while the lateral width w increases from right to left. Hence, the width w of the openings 125 decreases from left to right.

The insulation layer 120 may include further openings or recesses in other regions than the given region. Furthermore, the insulation layer 120 may be completely removed in one or more of the other regions.

Figure 1A:
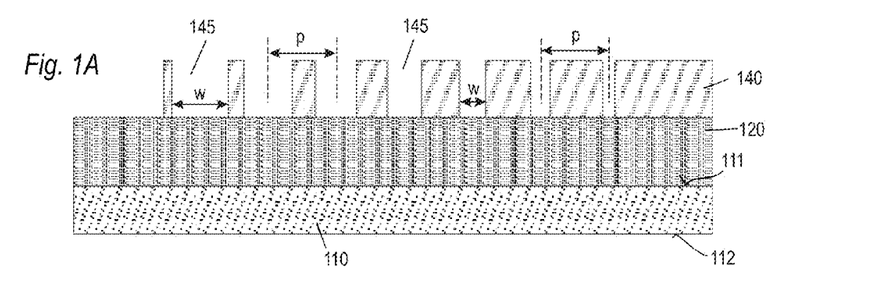
FIGS. 1A to 1D illustrate processes of a method for manufacturing a layer having a laterally varying thickness according to an embodiment.
Figure 1B:
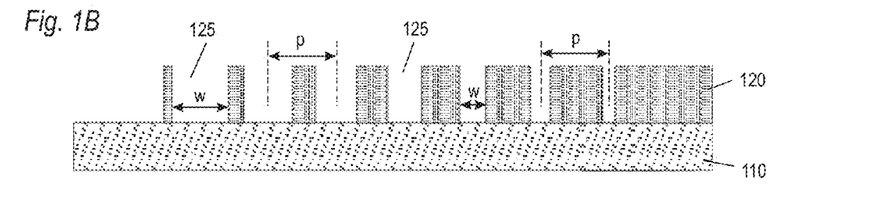

For forming the openings 125, a mask layer 140 is formed on the insulation layer 120 as illustrated in FIG. 1A. The mask layer 140 is structured to provide the mask layer 140 with a plurality of openings 145 that define the location and size of the openings 145 in the insulation layer 120. For structuring the mask 140, only one photolithographic process is needed, which significantly reduces manufacturing costs. For example, the mask layer 140 can be a resist layer that is exposed to radiation to transfer a pattern from a reticle to the mask layer 140. The pattern corresponds to the arrangement of the openings 145 and may include further structures. The exposed or unexposed portions, depending on whether the resist material of the mask layer 140 is comprised of a negative or positive photolithographic material, are chemically removed to form the openings 145 in the mask layer 140.

In a further process, the insulation layer 120 is etched using the mask layer 140 as etching mask to form the plurality of the openings 125 in the insulation layer 120. According to an embodiment, the etching is an isotropic etching. According to a further embodiment, the etching is an anisotropic etching.

The etching can be a single etching process or can include separate etching processes. For example, when the insulation layer 120 includes a layer stack of layers having different etching rates, the etching can include multiple etching processes that may be isotropic and/or anisotropic. Furthermore, the etching can include a first etching process and a second etching process, wherein one of the first and second etching processes is an isotropic etching process while the other one of the first and second etching processes is an anisotropic etching process. The first etching process and the second etching process may be performed regardless of whether the insulation layer 120 includes only one single layer or a layer stack.

According to an embodiment, dopants are implanted into the insulation layer 120 using the mask layer 140 as implantation mask. Typically, the implantation is carried out before etching of the insulation layer 120. The doping influences the etch properties of the material of the insulation layer 120 as described further below. The implantation can also be conducted prior to forming the mask layer 140. Furthermore, the etching can be conducted without the mask layer 140 when implantation of the insulation layer 120 is carried out using mask layer 140 as implantation mask. Since doped regions of the insulation layer 120 will be etched at a different etching rate than undoped regions, the insulation layer 120 can be structured without using the mask layer 140 as etching mask.

Figure 1C:
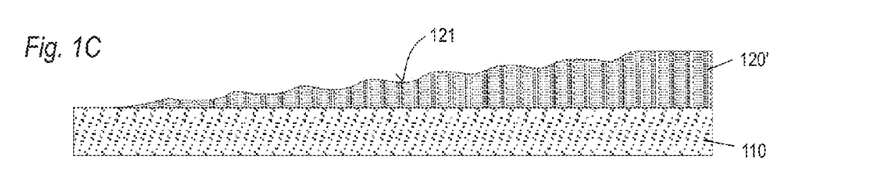

In a further process, as illustrated in FIG. 10, the insulation layer 120 provided with the openings 125 is tempered at elevated temperatures so that the insulation layer 120 at least partially diffluences. At the elevated temperature, the insulation layer 120 softens and starts to diffluence. The softened material spreads and closes the openings 125 of the insulation layer 120 to form a continuous insulation layer 120'. Since the openings 125 of the insulation layer 120 have a larger lateral width w in the left part of FIG. 1B than in the right part of FIG. 1B, more material of the insulation layer 120 is present in the right part. Therefore, the formed continuous insulation layer 120' will have a laterally increasing thickness from left to right. This is illustrated in FIG. 10.

The continuous insulation layer 120' forms an insulation layer having a laterally varying thickness. The continuous insulation layer 120' is also referred to as tempered insulation layer.

In the case of phosphorous glass as material of the insulation layer 120, the insulation layer 120 is heated to temperatures typically in a range of about 950° C. and 1050° C., for example about 1000° C. The annealing time typically ranges between about few minutes and few hours. Higher temperatures will speed up the softening and the flowability of the material of the insulation layer 120 while lower temperatures slow down the diffluencing process.

Typically, the tempering of the insulation layer 120 is carried out at an elevated temperature. In case of polymers, the temperature range is typically between about 100° C. and about 500° C. When using inorganic material for the insulation layer 120, the temperature range is between about 800° C. and about 1100° C., and typically between about 900° C. and about 1000° C., for example when using glass materials.

The continuous insulation layer 120' is thus provided with an inclined upper surface 121 with increasing thickness from left to right as can be seen in FIG. 10. The steepness of the upper surface 121 of the formed continuous insulation layer 120' can be adjusted by adapting the pitch p and/or the width w of the openings 125 in the insulation layer 120. It is particularly possible to provide the insulation layer 120 with a gradually increasing thickness. The angle between the upper surface 121 of the formed continuous insulation layer 120' and the first surface 111 of the substrate can be comparably small, for example a few degrees, such as equal to or below 5° or even below 2°. Furthermore, the angle between the upper surface 121 of the formed continuous insulation layer 120' and the first surface 111 of the substrate can be, according to an embodiment, between about 5° and about 20°. According to a further embodiment, the angle can be between about 20° and about 50°. Such inclined surfaces can also be transferred into the substrate 110 so that the first surface 111 of the substrate 110 is also provided with an inclined surface. The transfer of the inclined surface into the substrate 110 is described further below.

According to an embodiment, the angle between the upper surface 121 of the formed continuous insulation layer 120' and the first surface 111 of the substrate can be equal to or below 10° or can be between about 1° and about 10°. Such gently inclined surfaces are, for example, beneficial for dielectric layers or insulation layers that, for example, are used as field oxides in edge termination regions.

According to an embodiment, the angle can be larger than about 20°. More steep surfaces are, for example, suitable for mesa-structures formed in a semiconductor substrate.

Depending on the actual arrangement of the openings 125, i.e. their distribution and variation of the lateral width w, the continuous insulation layer 120' is provided with a laterally varying thickness at least in the given region, wherein the height profile of the thus formed insulation layer 120' depends on the lateral distribution of the openings 125 and their width w. Hence, any height or thickness profile can be produced by appropriately arranging the openings 125. For example, the insulation layer 120 can be provided with different regions each including a plurality of openings 125 to form regions with an increasing thickness. Furthermore, a first region of the insulation layer 120 can be defined having a plurality of openings 125 of decreasing lateral width w in a first direction while a second region of the insulation layer 120 can be defined having a plurality of openings 125 of increasing lateral width w in the first direction. Each of the first and second regions of the insulation layer 120 can also be provided with openings 125 having different pitch p and/or different lateral width w in the same lateral direction or in different lateral directions.

Residual ripples may remain on the upper surface 121 of the continuous insulation layer 120' as illustrated in FIG. 10. Formation of such ripples can be reduced by increasing the temperature of the tempering process. To prevent the material of the insulation layer 120 from becoming too soft and spreading completely over the first surface 111 of the substrate 110, the temperature is limited to a given maximum value depending on the material of the insulation layer 120 and the time given for the tempering process. If ripples remain after the tempering process, they can be reduced or removed by subsequent etching.

The reflow properties of the material of the insulation layer 120 can be adjusted, for example, by suitably doping of the insulation layer 120. For example, in addition to doping with phosphorous, doping with boron can be carried out. Furthermore, when the insulation layer 120 includes two or more layers of different doping concentration, the reflow properties of these layers are different. For example, a lower layer can have reduced reflow properties, i.e. that the insulation layer 120 begins to soften at higher temperatures or is less pronounced, while an upper layer can be provided with improved reflow properties at the same temperature. When such an insulation layer 120 is heated, the upper layer diffluences earlier and stronger than the lower layer so that the openings 125 are filled with the material of the upper layer while the lower layer is still solid and keeps its shape.

As described herein, an insulation layer having a continuous surface with a given surface profile is formed by providing a discontinuous layer that is formed by insulation layer 120 having a plurality of openings 125 forming discontinuities, and heating the discontinuous layer to soften the material of the discontinuous layer so that it diffluences until the discontinuities of the discontinuous layer vanish and the continuous layer is formed. The final surface or thickness profile of the continuous layer is determined by the geometrical arrangement of the discontinuities in the discontinuous layer.

Figure 1D:
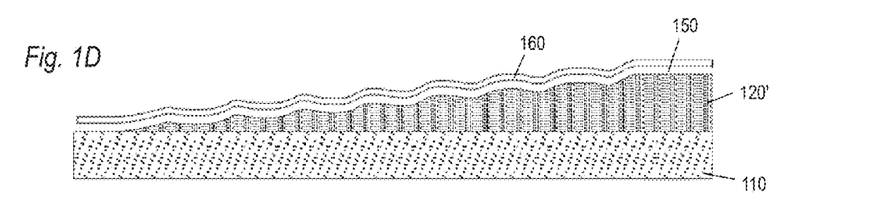

In a further process, as illustrated in FIG. 1D, a metal layer 160 is formed on the continuous insulation layer 120'. Optionally, an insulating layer 150 can be formed on the surface 121 of the continuous insulation layer 120' prior to forming the metal layer 160. The metal layer 160 can be formed by any suitable process such as depositing, for example PVD or CVD.

The metal layer 160 can be, for example, a field-plate of an edge termination structure of a power semiconductor device. In this case, FIGS. 1A to 1D illustrate a section of the periphery of the semiconductor device where the edge termination structure is formed. According to an embodiment, two or more field-plates can be formed on the continuous insulation layer 120'. The continuous insulation layer 120' is then provided with different regions, each of which has an increasing thickness profile with the thickness of each region increasing towards the outer rim of the semiconductor device. Separate metal layers 160 are then formed on each of the different regions of the continuous insulation layer 120' so that the distance between each of the metal layers 160 and the surface 111 of the substrate 110 increases towards the outer rim of the semiconductor device.

The edge termination structure can also include so-called field rings that are doping regions, wherein a given doping region is electrically connected to a given field-plate. Typically, the field rings are electrically "floating".

By transforming the insulation layer 120 having a constant thickness into an insulation layer with regions of continuously increasing thickness, the metal layer 160 or metals layers 160 that are formed on the continuous insulation layer 120' do not have sharp edges. Hence, electrical field peaks in the continuous insulation layer 120' and the substrate 110 below metal layers 160 are prevented. This and the well-defined gradient of the thickness of the continuous insulation layer 120' allow reduction of the maximum lateral extension of the edge termination structure. Furthermore, the blocking characteristics of the device are improved since the likelihood of a dielectric breakdown is reduced.

Furthermore, the approach described herein allows a significant reduction of mask layers that are commonly needed to form insulation layer with increasing thickness by a step process. For example, the number of lithographical processes can be reduced by one or two, or even more, in comparison with commonly used step processes. Furthermore, the number of required field-plates for a given rated blocking voltage of a device can be decreased by using the insulation layer with varying thickness. With optimized thickness, and gradient of the insulation layer, a single field-plate can be sufficient even for very high rated blocking voltages of the device.

According to an embodiment, the continuous insulation layer 120' as formed above is used as etching mask to implant dopants into the substrate 110 that can be a semiconductor material into which semiconductor devices are integrated. When implanting dopants into the semiconductor substrate 110, the depth of the implantation rises with the increasing thickness of the continuous insulation layer 120'. For example, the implantation depth is adjusted such that the peak of the concentration of the implanted dopants is at a given depth from the first surface 111 of the semiconductor substrate 110 when no continuous insulation layer 120' or other mask is used. In regions covered by the continuous insulation layer 120', the implantation depth in the semiconductor substrate 110 varies depending on the local thickness of the continuous insulation layer 120'. It is therefore possible to form a doping region in the semiconductor substrate 110 with a laterally varying implantation depth. This can be, for example, beneficial for edge termination regions having a laterally varying doping (VLD).

Alternatively or in combination with the above, the continuous insulation layer 120' can be used as an implantation mask to laterally vary concentration of the implanted dopants according to an embodiment. For example, the implantation depth may be adjusted for obtaining a shallow implantation, i.e. the implantation peak is substantially at the first surface 111 of the semiconductor substrate 110. When using the continuous insulation layer 120' as an implantation mask, the amount of dopants that will be implanted in the semiconductor substrate 110 reduces, depending on the local thickness of the continuous insulation layer 120', since now only the implantation trail reaches the substrate 110.

Figure 9:
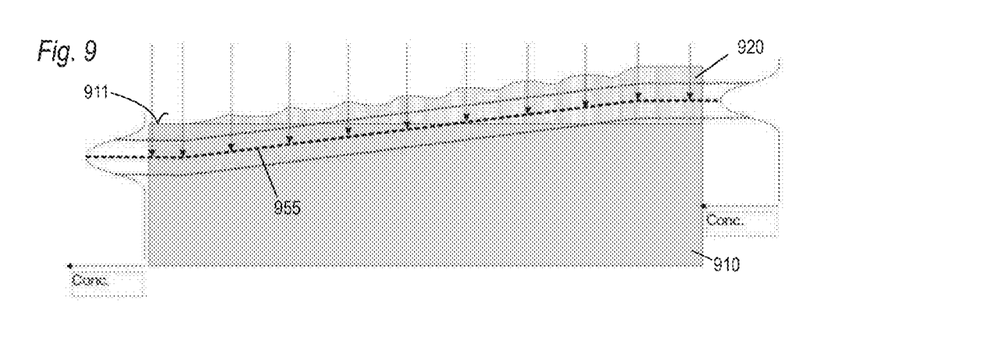
FIG. 9 illustrates a semiconductor device using an insulation layer having a laterally varying thickness to form a VLD doping profile according to an embodiment.

A specific embodiment is illustrated in FIG. 9, which shows a semiconductor substrate 910 having an insulation layer 920 with increasing thickness from left to right on a first or upper surface 911 of the semiconductor device 910. The insulation layer 920 is used as a mask for implantation. The implantation is indicated by the arrows in FIG. 9. Due to the increasing thickness of the insulation layer 920, the vertical depth of the resulting doping profile varies with the thickness of the insulation layer 920. The peak concentration of the doping of the doping profile is indicated at 955 showing that the peak doping concentration increases from left to right. The structure shown in FIG. 9 can be used as a VLD edge-termination (varying lateral doping). The insulation layer can be an inorganic layer such as a oxide layer or glass layer, or can be an organic layer such as a polymeric layer.

The insulation layer 910 may be provided with a varying thickness gradient, for example with an increasing thickness gradient from left to right, to obtain a curved course of the doping profile when seen in a vertical cross-section.

With respect to FIGS. 2A to 2E, a further embodiment is described.

Similar to the embodiment of FIGS. 1A to 1D, a substrate 110 such as a semiconductor material is provided. The substrate 110 includes a first surface 111 and a second surface 112 opposite to the first surface 111.

An insulation layer is formed on the first surface 111 of the substrate 110. The insulation layer includes a first insulation layer 220 formed on the first surface 111 of the substrate 110 and a second insulation layer 230 formed on the first insulation layer 220, so that a layer stack is formed on the first surface 111 of the substrate 110. Hence, the first insulation layer 220 is arranged between the substrate 110 and the second insulation layer 230.

According to an embodiment, the first insulation layer 220 and the second insulation layer 230 differ from each other at least in one of vertical thickness and material. For example, the materials of the first and second insulation layer 220, 230 can differ in their etching characteristics with respect to a common etching process. The different etching characteristics such as etching rates can be adjusted by implantation as described above.

According to an embodiment, the insulation layer further includes an etch stop layer 205 arranged between the first insulation layer 220 and the second insulation layer 230. The etch stop layer 205 is interposed between the first and second insulation layer 220, 230 so that a layer stack including the first insulation layer 220, the etch stop layer 205, and the second insulation layer 230 is formed.

Figure 2A:
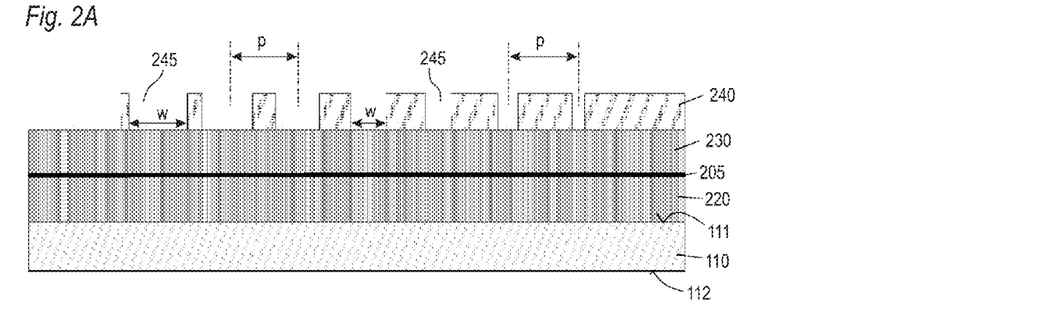
FIGS. 2A to 2E illustrate processes of a method for manufacturing a layer having a laterally varying thickness according to an embodiment.

As illustrated in FIG. 2A, a mask layer 240 is formed on the second insulation layer 230. The mask layer 240 is structured to provide the mask layer 240 with a plurality of openings 245 that define the location and size of a plurality of at least one of recesses and openings to be formed in the insulation layer. The formation of the mask layer 240 including the geometrical arrangement of the openings 245 can be carried out as described above.

The arrangement of the openings 245 can vary as described above. In the present embodiment, the lateral pitch p of the openings 245 remains constant while the lateral width w increases from left to right.

Figure 2B:
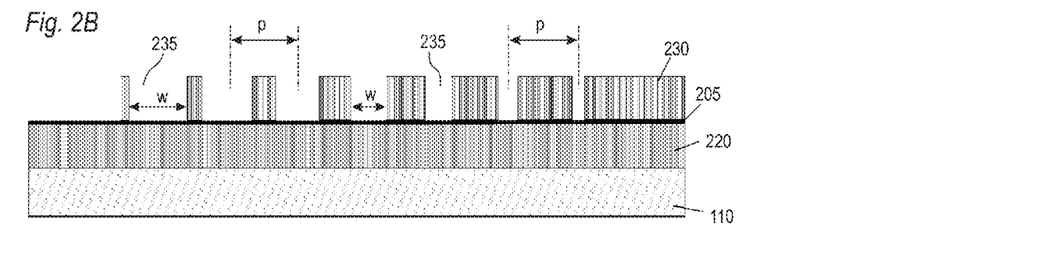

In a further process, as illustrated in FIG. 2B, the second insulation layer 230 is etched using the mask layer 240 as etching mask to form openings 235 in the second insulation layer 230, the openings extending up to the etch stop layer 205. The etch stop layer 205 functions as etch stops here, i.e. the etch stop layer has a significantly lower etching rate than the second insulation layer 230. For example, the etch stop layer 205 is comprised of a material different to a material of the second insulation layer 230, so that the etch stop layer 205 is etched at a reduced etching rate during etching in comparison with the second insulation layer 230.

In an embodiment, the etch stop layer 205 is comprised of a material that is etched at substantially the same etching rate as the second insulation layer 230 during etching. In this case, the etching will not stop at the etch stop layer 205. However, the etch stop layer 205 serves as a monitoring layer that allows for detection of when the etching reaches the etch stop layer 205. Hence, the etching process can further include monitoring the etching, detecting when the etching reaches the etch stop layer 205, and stopping the etching when the etching reaches the etch stop layer 205. The monitoring can include detection of material compositions specific to the etch stop layer 205.

When etching is performed with a high physical etching rate, the etch stop layer 205 is typically also partially removed. When the etch stop layer 205 is used as monitoring layer, etch stop layer 205 is typically partially or completely removed. The extent of the removal depends on the resistivity of the etch stop layer 205 against the used etching process. According to an embodiment, the etch stop layer 205 is also structured.

Figure 2C:
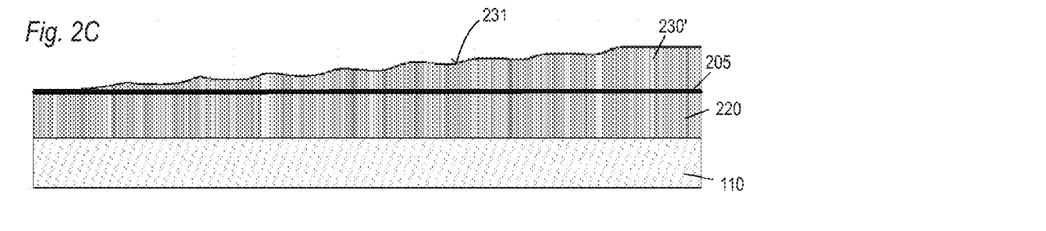

In a further process, as illustrated in FIG. 2C, the substrate 110 is subjected to a tempering process that is referred to as a first tempering process. The first tempering process results in softening and diffluencing of at least the second insulation layer 230, which is thus converted into a continuous insulation layer 230' having an increasing thickness due to the given arrangement of the openings 235. The upper surface 231 of the insulation layer 230' is slightly inclined.

During the first tempering process, the first insulation layer 220 and the etch stop layer 205 may also soften. However, since both of them are typically unstructured, they will not diffluence. Alternatively, the etching may also partially remove the etch stop layer 205 so that the etch stop layer 205 can also diffluence to a given extend. Moreover, when the etch stop layer 205 and/or the first insulation layer 220 are of different material than the second insulation layer 220, softening of the first insulation layer 220 and the etch stop layer 205 can be prevented.

The resulting structure after the tempering process is illustrated in FIG. 2C showing the continuous insulation layer 230' formed on the etch stop layer 205. The etch stop layer 205 may also partially be removed during etching. Furthermore, the etch stop layer 205 may be less susceptible to the first tempering process than the second insulation layer 230 and does not soften.

Subsequently, an etching process is carried out, where the etching process is typically non-selective with respect to the continuous insulation layer 230' (second insulation layer 230), the etch stop layer 205 and the first insulation layer 220. Typically, the etching process is an isotropic etching process and transfers the surface profile of the continuous insulation layer 230' onto the first insulation layer 220, which will be transformed into an insulation layer 220' having an inclined or gradually rising surface 221. When using an isotropic etching process, the ripples of the continuous insulation layer 230' vanish and will not, or only partially, be transferred to the insulation layer 220'. Alternatively, when using a more anisotropic process, the surface structure of the continuous insulation layer 230' will be transferred in a more pronounced way so that the ripples of the continuous insulation layer 230' will also be transferred to the insulation layer 220'.

The lateral extension of the ripples is substantially determined by the pitch p of the openings 245. Hence, the crests of the ripples may laterally vary.

Depending on the pattern of the openings 235 and their geometrical relations, the insulation layer 220' is provided with a laterally varying thickness in given regions.

In an embodiment, a damage implantation into the first insulation layer 220 as described above is carried out using the continuous insulation layer 230' as implantation mask. For example, when the implantation depth is adjusted to be within the first insulation layer 220, the damaged portion of the first insulation layer 220 rises within the first insulation layer 220 with the increasing thickness of the continuous insulation layer 230'. This further allows for adjustment of the flow properties when diffluencing the first insulation layer 220.

Figure 2D:
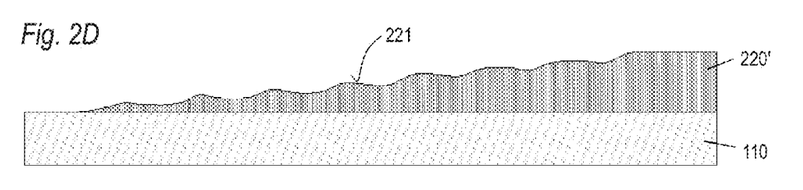

During the etching process, the continuous insulation layer 230' and the etch stop layer 205 may be completely removed. Alternatively, portions of the continuous insulation layer 230' and the etch stop layer 205 may remain depending on the etching time. The resulting structure is illustrated in FIG. 2D.

In an embodiment, the insulation layer 220' is subjected to a second tempering process. The second tempering process can be carried out in a similar temperature range as the first tempering process or even at a higher temperature, for example when different materials are used for the first and second insulation layer 220, 230. Typically, the materials for the first insulation layer 220 and the second insulation layer 230 are selected such that the second insulation layer 230 diffluences at the same or lower temperatures than the first insulation layer 220.

In an embodiment, the formation and reduction of surface ripples may be controlled by adapting the etching characteristics of the first and second insulation layers 220, 230. For example, different insulation materials can be used to provide the first and second insulation layers 220, 230 with different etching rates. Furthermore, the doping level can be appropriately adapted to obtain different etching rates. Moreover, controlled damage implantations can be carried out.

According to an embodiment, the mask layer 240 can be made of a resist that is capable of diffluencing when subjected to a tempering process. In this case, the second insulation layer 230 can be omitted since the diffluenced mask layer 240 provides the functionality of the second insulation layer 230.

Figure 2E:
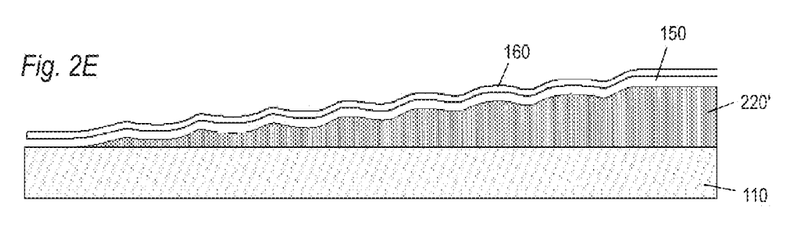

In a further process, as illustrated in FIG. 2E, an optional insulating layer 150 and a metal layer 160 are deposited in this order on the surface 221 of the insulation layer 220' as described above.

A further embodiment will be described with reference to FIGS. 3A to 3C.

In the above embodiments, the layers that are provided with a gradually increasing thickness were subjected to a tempering process that causes the respective layers to soften and diffluence. This approach is not suitable to provide, for example, the substrate with a gradually varying surface profile. In particular, when the substrate is a semiconductor material, very high temperatures would be needed that would, however, destroy other structures in the substrate. In cases like this, the approach as illustrated in FIGS. 2A to 2E is an option to provide layers or substrates that either do not tend to soften or that soften only at very high temperatures with a surface profile. The embodiment illustrated in FIGS. 3A to 3C uses this approach to provide the substrate 110 with a laterally varying surface profile.

Figure 3A:
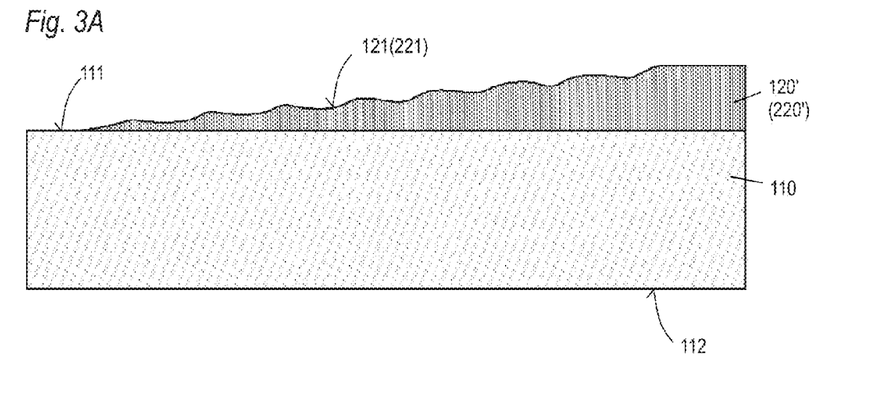
FIGS. 3A to 3C illustrate processes of a method for manufacturing a semiconductor substrate having an inclined surface portion according to an embodiment.

As illustrated in FIG. 3A, on the first surface 111 of the substrate 110, which is a semiconductor material such as silicon, silicon carbide or a III-V semiconductor material, an insulation layer with a gradually increasing thickness is formed. This insulation layer can be the continuous insulation layer 120' of FIG. 10 or the insulation layer 220' having an inclined or gradually rising surface 221 of FIG. 2D. Hence, any of the above described processes can be used for forming this insulation layer. To avoid repetition, reference is made to the above described processes. In the following, the insulation layer having a gradually increasing thickness is referred to as insulation layer 220'.

In a further process, the insulation layer 220' and the semiconductor substrate 110 are etched in a common etching process to remove the insulation layer 220' at least in a given region and to provide the semiconductor substrate 110 with an inclined surface portion 111a at least in the given region. The resulting structure is illustrated in FIG. 3B.

Typically, a non-selective common etching process or a common etching process with only a small selectivity is employed to ensure a transfer of the surface profile of the insulation layer 220' to the semiconductor substrate 110. For example, plasma etching processes with a high physical etching rate can be used as non-selective etching process. Such a process is more anisotropic. When a more isotropic etching process is desired, a chemical etching is employed, which can use, for example, $SF_6$ or $CHF_3$ as etchants. The insulation layer 220' and the semiconductor substrate 110 are etched with substantially the same etching rate during the common etching process. In the case that phosphorous glass is the material for the insulation layer 220' and silicon is the material of the semiconductor substrate 110, the etching can be carried out using one of the above described processes.

According to an embodiment, the insulation layer 220' and the semiconductor substrate 110 are etched with a different etching rate during the common etching process. For example, when the semiconductor substrate 110 is more susceptible to the common etching process, the profile transfer is enhanced leading to a more pronounced surface profile of the surface of the semiconductor substrate 110. This is indicated in FIG. 3C by the surface 111c of the semiconductor substrate 110, which rises steeper than the surface portion 111a formed when both the insulation layer 220' and the semiconductor substrate 110 have the same etching rate.

Figure 3B:
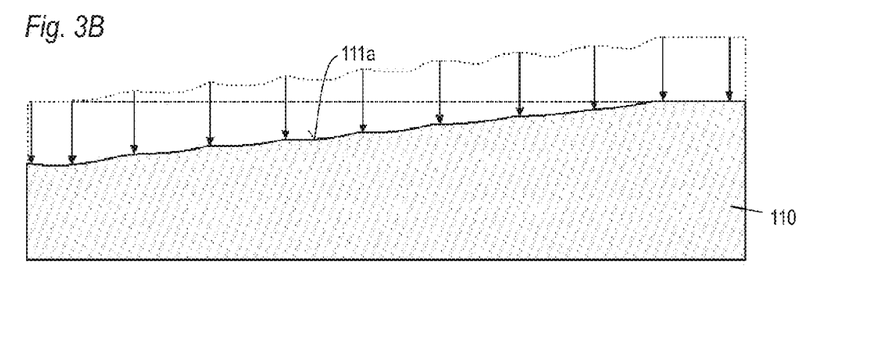
Figure 3C:
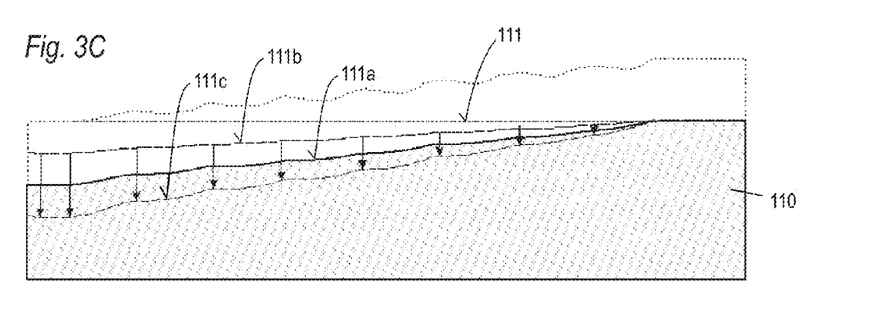

Alternatively, when the insulation layer 220' is more susceptible to the common etching process than the semiconductor substrate 110, the surface profile transfer is less pronounced as indicated by the only slightly rising surface portion 111b of the semiconductor substrate 110 in FIG. 3C.

Therefore, the ratio between the etching rate of the material of the insulation layer 220' and the etching rate of the material of the semiconductor substrate 110 defines the ratio at which the surface profile, or structure height, of the insulation layer 220' is transferred onto the substrate 110.

The processes as illustrated in FIGS. 3A to 3C can be combined with any of the other processes as described herein. For example, an insulation layer having a laterally varying thickness can be formed by any of the above processes on the semiconductor substrate 110 manufactured according to the embodiment illustrated in FIGS. 3A to 3C. Examples of semiconductor devices formed using multiple processes are shown in FIGS. 4A and 4B, respectively.

Figure 4A:
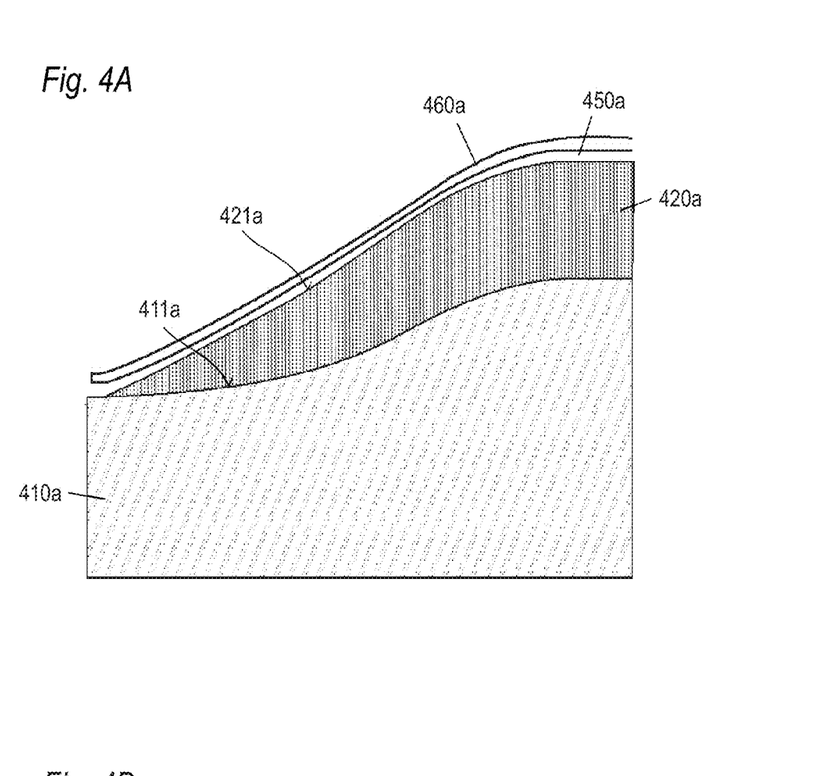
FIGS. 4A and 4B illustrate processes of a method for manufacturing a semiconductor substrate having an inclined surface portion and an insulation layer having a laterally varying thickness according to several embodiments.
Figure 4B:
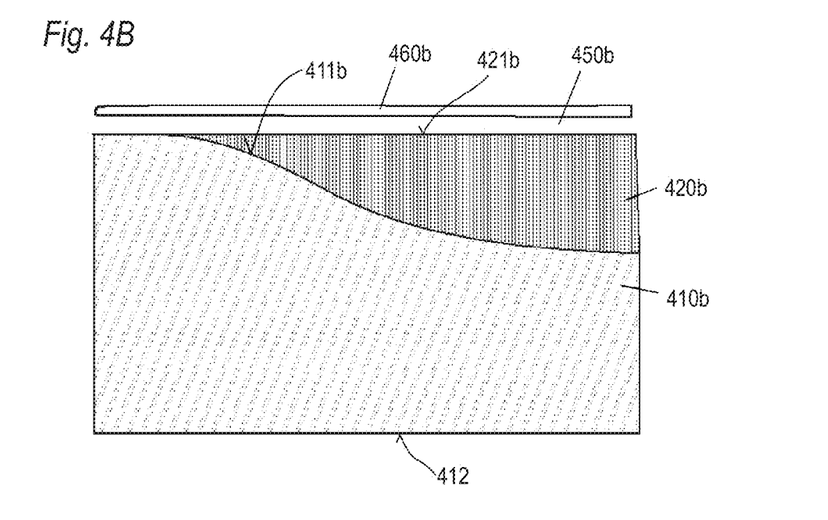

According to an embodiment, as illustrated in FIG. 4A, a further insulation layer 420a is formed on the etched semiconductor substrate 410a that has been provided with a gradually increasing surface 411a. As illustrated in FIG. 4A, the surface 411a of the semiconductor substrate 410a can be curved instead of substantially linearly rising. For obtaining such profiles, the pattern of the openings in the insulation layer, which pattern is used to form the insulation layer 220' is appropriately adapted. Many different surface profiles may be obtained, including profiles with thickness variations of the semiconductor wafer, and the profiles shown in the embodiments are only examples. Furthermore, any arbitrary gradient of the surface profile of the semiconductor substrate or wafer, or of any functional layer such as insulation layer, is possible using the approach described herein. Thus, the obtained varying surface profile of the substrate or the functional layer can be used for transferring the profile on other layers such as by etching or when depositing material on the surface profile.

Figure 10A:
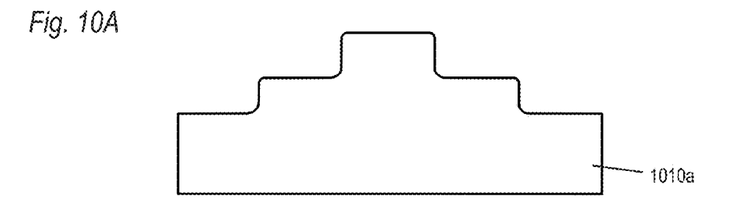
FIGS. 10A and 10B illustrate surface profiles according to embodiments.
Figure 10B:
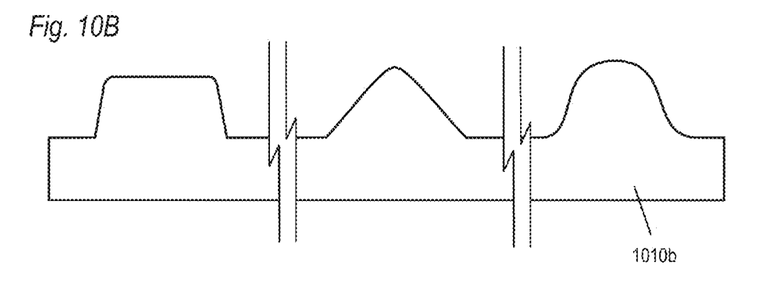

Examples of various surface profiles are illustrated in FIGS. 10A and 10B. FIG. 10A illustrates a substrate 1010a with a step-wise increasing and then decreasing surface profile, while FIG. 10B illustrates a substrate 1010b having different surface profiles such as trapezoidal surface profiles also known as mesa-regions (left in FIG. 10B), triangularly shaped profiles (center of FIG. 10B), and round profiles (right in FIG. 10B). The surface profiles shown in FIGS. 10A and 10B apply to both the semiconductor substrate and the insulation layer.

In a further process, a plurality of at least one of recesses and openings are formed in the further insulation layer 420a as described above. The insulation layer 420a is tempered at elevated temperature so that the insulation layer 420a diffluences to provide the insulation layer 420a with a laterally increasing thickness in the given region or a further given region. The thickness of the further insulation layer 420a and the height of the surface 411a of the semiconductor substrate 410a increases in the same lateral direction so that the surface 421a of the further insulation layer 420a significantly rises as illustrated in FIG. 4A.

An optional insulating layer 450a and a metal layer 460a can be formed as described above. Alternatively, layer 450a can be a metal layer and layer 460a can be an insulating layer.

FIG. 4B illustrates an embodiment where the lateral variation of the thickness of the further insulation layer 420b and the surface profile of the semiconductor substrate 410b compensate each other so that both together form a flat surface 421b. The surface of the semiconductor substrate 410b is illustrated at 411b. The flat surface 421b of the semiconductor device does not have a profile but is substantially parallel to the second surface 412 of the semiconductor substrate 410b.

Both the surface profile of the semiconductor substrate 410b and the further insulation layer 420b can be manufactured as described above. Layers 450a and 450b, which can be a metal layer and an insulating layer, or any other layers, can be formed on the flat surface 421b.

The processes described in connection with FIGS. 4A and 4B can also be combined with additional implantation processes using the insulation layer 420a or the further insulation layer 420b as implantation mask to form doping regions having a laterally varying implantation depth and/or a laterally varying doping concentration as described above.

Figure 5A:
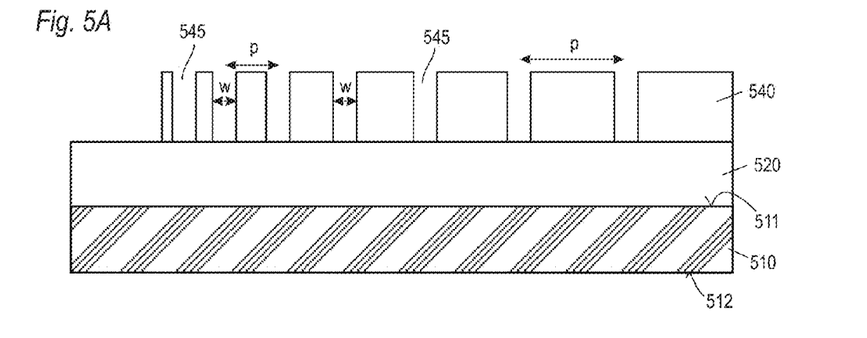
FIGS. 5A to 5C illustrate processes of a method for manufacturing a layer having a laterally varying thickness according to an embodiment.
Figures 5B, 5C:
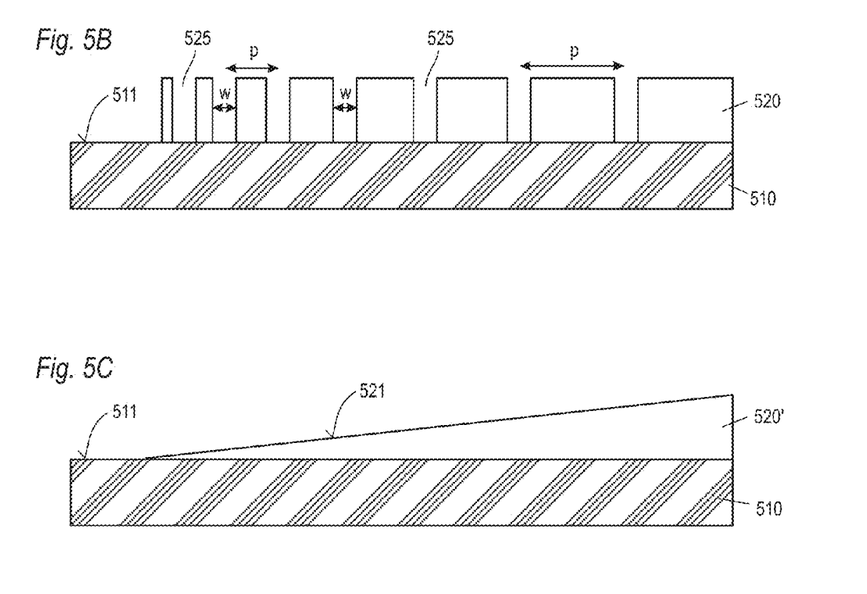

FIGS. 5A to 5C illustrate an embodiment where the lateral width w of the openings is constant while the pitch p changes.

As described above, a substrate 510 having a first surface 511 and a second surface 512 is provided. An insulation layer 520 is formed on the first surface 511 of the substrate 510. A mask layer 540 having a plurality of openings 545 defining the size and location of the openings to be formed in the insulating layer 520 is formed on the insulation layer 520 as described above. The pitch p of the openings 545 increases towards the right side, which can be a rim of a semiconductor device, while the lateral width w remains constant.

Using an etching process, the pattern of openings 545 is transferred into the insulation layer 520 so that the insulation 520 is provided with corresponding openings 525. The resulting structure after removal of the mask layer 520 is illustrated in FIG. 5B.

The structured insulation layer 520 is subjected to a tempering process as described above. The tempering process transforms the insulation layer 520 into an insulation layer 520' having a gradually increasing thickness and a gradually rising surface 521 as illustrated in FIG. 5C. Portions of the first surface 511 of the substrate 510 are exposed in regions where the insulation layer 520 was completely removed so that no material was left for forming even a thin insulation layer 520' during the tempering process.

Figure 6A:
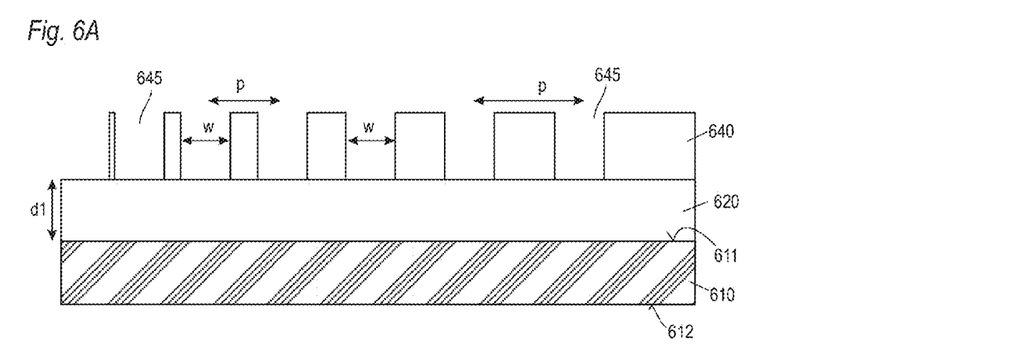
FIGS. 6A to 6C illustrate processes of a method for manufacturing a layer having a laterally varying thickness according to an embodiment.
Figure 6B:
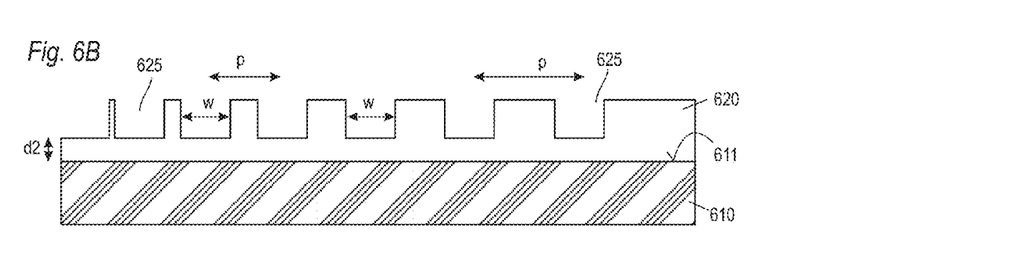
Figure 6C:
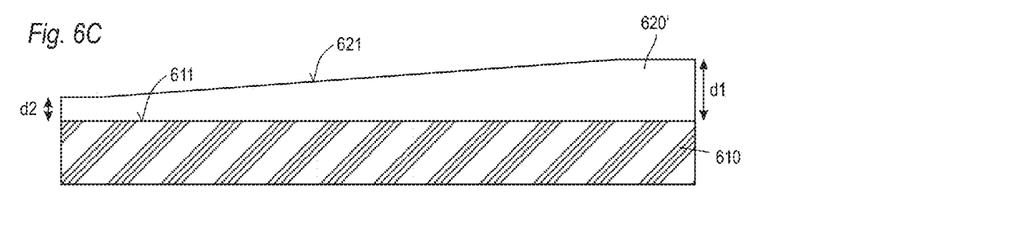

FIG. 6A to 6C illustrates an embodiment where recesses are formed in the insulation layer.

As described above, a substrate 610 having a first surface 611 and a second surface 612 is provided. An insulation layer 620 is formed on the first surface 611 of the substrate 610. A mask layer 640 having a plurality of openings 645 defining the size and location of the recesses to be formed in the insulating layer 620 is formed on the insulation layer 620 as described above. The pitch p of the openings 645 of the mask layer 640 varies in the lateral direction while the width w remains constant as illustrated in FIG. 6A.

Using an etching process, the pattern of openings 645 is transferred into the insulation layer 620 so that the insulation 620 is provided with corresponding recesses 625. The etching process is controlled so that the etching does not reach the first surface 611 of the substrate 610. In an embodiment, the insulation layer 620 includes two layers having different etching rates. In another embodiment, the insulation layer 620 includes two layers and an etch stop layer interposed between the two insulation layers. This provides for a good controllability of the etching process as described above.

As illustrated in FIGS. 6A and 6B, the etching process etches the insulation layer 620 from an initial or first thickness d1 to a second thickness d2. The resulting structure after removal of the mask layer 620 is illustrated in FIG. 6B.

The structured insulation layer 620 is then subjected to a tempering process as described above. The tempering process transforms the insulation layer 620 into an insulation layer 620' having a gradually increasing thickness and a gradually rising surface 621 as illustrated in FIG. 6C. Since the insulation layer 620 was not completely removed in any portion of the substrate 610, the first surface 611 of the substrate 610 remains completely covered by the insulation layer 620'. Therefore, the insulation layer 620' after the tempering process increases from the second thickness d2 shown to the left in FIG. 6C to the first thickness d1 shown to the right of FIG. 6C.

Figure 7A:
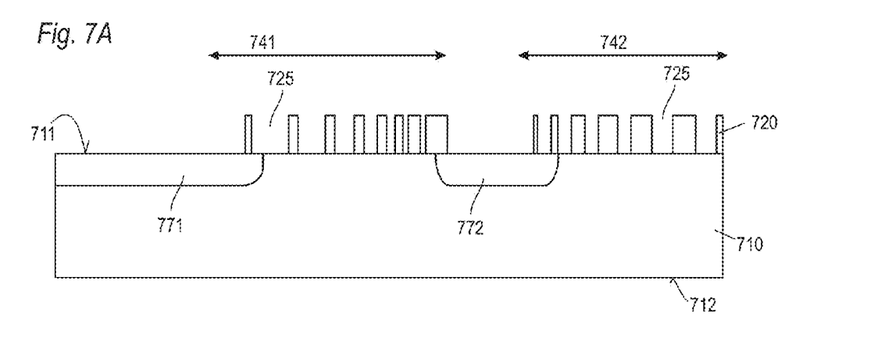
FIGS. 7A to 7B illustrate processes of a method for manufacturing a layer having a laterally varying thickness in separate regions according to an embodiment.
Figure 7B:
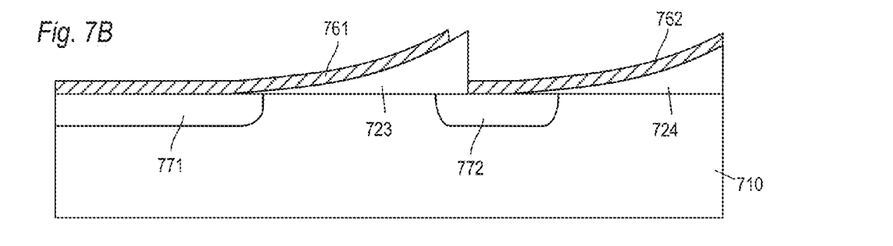

FIGS. 7A and 7B illustrates an embodiment for manufacturing a semiconductor device having an edge termination structure with two field-plates.

As described above, a semiconductor substrate 710 having a first surface 711 and a second surface 712 is provided. Doping regions 771, 772 extending up to the first surface 711 are formed in the semiconductor substrate 710. For power semiconductor devices, the semiconductor substrate 710 is typically lightly n-doped while the doping regions 771, 772 are p-doped. The doping regions 771, 772 form field rings of the edge termination structure while the lightly n-doped regions of the semiconductor device are part of the drift region. Doping region 771 can also be a cathode region of a diode or a body region of a field-effect transistor.

An insulation layer 720 is formed on the first surface 711 of the semiconductor substrate 710. A first group of openings 725 is formed in a first region 741 of the insulation layer 720, and a second group of openings 725 is formed in a second region 742 of the insulation layer 720. The first and the second regions 741, 742 are spaced apart from each other. Hence, the insulation layer 720 includes a plurality of openings 725 in two separate and spaced apart regions 741 and 742. In each region 741 and 742, the size distribution of the openings 725, i.e. the lateral width and the pitch p can be different and can vary differently. This is illustrated in FIG. 7A.

In each region 741, 742 of the insulation layer 720, the insulation layer 720 is completely removed in the left part of the respective region 741, 742.

The arrangement of the openings 725 of the insulation layer 720 is such that more material of the insulation layer 720 is left towards the right side in each region 741, 742 since the right side faces the lateral rim of the semiconductor device.

The structured insulation layer 720 is subjected to a tempering process as described above. The tempering process transforms the insulation layer 720 into an insulation layer having two separate and spaced apart regions 723, 724 with increasing thickness. In the left part of each region 723, 724, no material of the insulation layer 720 remains on the surface 711 of the semiconductor substrate 710 so that the semiconductor substrate 710 and particularly the doping regions 771, 772 remains exposed.

Each of the diffluenced regions or portions 723, 724 of the insulation layer 720 have a gradually rising surface towards the rim of the semiconductor substrate 710.

The openings 725 in the insulation layer 720 can be adapted such that the surface of the diffluenced regions or portions 723, 724 will have a curved surface, for example, a convex surface. For forming edge termination structures with improved blocking capabilities, the surface of the diffluenced regions or portions 723, 724 can have a hyperbolic shape since this provides an optimized course of the field electrodes on the diffluenced regions or portions 723, 724.

In a further process, metal layers 761, 762 are formed on the portions 723, 724 of the insulation layer and the exposed doping regions 771, 772 so that a respective one of the metal layers 761, 762 is in ohmic contact with a respective one of the doping regions 771, 772. The separate metal layers 761, 762 form separate field-plates of the edge termination structure. When the surface of the diffluenced regions or portions 723, 724 follows a hyperbolic course as illustrated in FIG. 7B, the vertical distance of the field-plates 761, 762 from the surface of the semiconductor substrate 710 increases in the same way leading to an optimized field-plate geometry.

As described above, a method is provided that allows for formation of one or more field-plates on an insulation layer having a laterally varying thickness without any sharp edges of and below the field-plates. This increases the blocking capabilities of semiconductor devices and/or reduces the space needed for edge termination structures. Moreover, a method is provided that allows formation of surface profiles or height profiles in materials that are difficult to diffluence.

The processes as described above allow the formation of any slope, inclined surface with a constant or varying gradient, or any type of flank on mesa-structures of semiconductor material. Such mesa-structures are employed, for example, in edge termination structures having a negative slope or angle. Such edge termination structures can be combined with so-called depletion etch structure.

The processes as described above can also be employed for providing gate dielectrics with a laterally varying thickness. This allows the gate capacitance to be laterally varied, or "modulated." Furthermore, the threshold-voltage of a FET can be laterally adjusted when varying the thickness of the gate dielectric.

Figure 8:
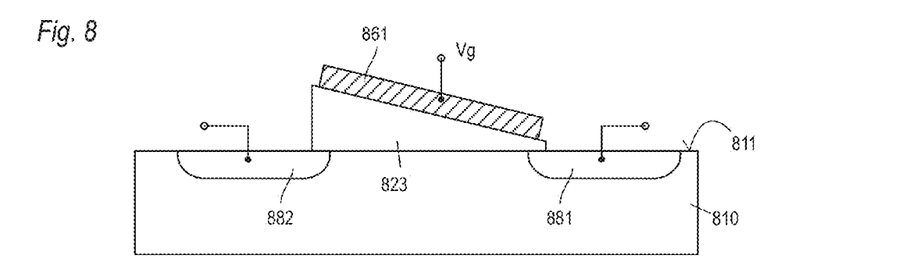
FIG. 8 illustrates a semiconductor device having a gate electrode on a gate dielectric with a laterally increasing thickness according to an embodiment.

This is illustrated in FIG. 8 showing a further embodiment. Two doping regions, such as a source region 881, forming a first doping region, and a drain region 882, forming a second doping region, are formed in a semiconductor substrate 810 that forms a third doping region in this embodiment. The source region 881 and the drain region 882 are spaced apart from each other and are of opposite conductivity type than the semiconductor substrate 810. On a first surface 811 of the semiconductor substrate 810, an insulation layer 823 with a laterally increasing thickness is formed between the source region 881 and the drain region 882. The insulation layer 823 forms a gate dielectric on which a gate electrode 861 is formed. The threshold for forming an inversion channel between the source region 881 and the drain region 882 laterally increases from the source region 881 to the drain region 882 allowing for tailoring of the switching behavior of the device.

According to an embodiment, the first doping region is formed by a source region, the third doping is formed by a body region, and the second doping region is formed by a drift region of a power FET or power IGBT.

According to an embodiment, a semiconductor device includes a semiconductor substrate having a first surface, an insulation layer having a laterally varying thickness on the first surface, and a metal layer on the first surface. The semiconductor device further includes a first doping region in the semiconductor substrate, a second doping region in the semiconductor substrate, and a third doping region between the first doping region and the second doping region. The third doping region is of opposite conductivity type than the first doping region and the second doping region and forms respective pn-junctions with the semiconductor substrate. The first doping region is spaced apart from the second doping region by the third doping region to form a channel region in the third doping region between the first doping region and the second doping region, wherein the insulation layer having a laterally varying thickness is formed on the third doping region.

Furthermore, the insulation layer can also be provided with a laterally varying thickness by locally varying the etching rate. The etching rate can be adjusted, for example, by a suitable damage implantation as described above. A masked proton or helium implantation can be used for adapting the etching rate.

The above processes can be controlled and verified, for example, by preparing a cross-section of the substrate in the respective region where the insulation layer or the substrate is provided with a surface profile.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a layer with a laterally varying thickness, the method comprising:
providing a substrate with a first surface and an insulation layer formed on the first surface of the substrate;
forming a plurality of at least one of recesses and openings in the insulation layer, the plurality of the at least one of recesses and openings arranged at a pitch (p), and each of the at least one of recesses and openings having a lateral width (w), wherein at least one of the pitch (p) and the lateral width (w) varies in a lateral direction, and wherein the plurality of the at least one of recesses and openings defines a given region in the insulation layer; and
tempering the insulation layer comprising the plurality of the at least one of the recesses and openings at elevated temperatures so that the insulation layer at least partially diffluences to provide the insulation layer with a laterally varying thickness at least in the given region.

2. The method of claim 1, further comprising:
forming a mask layer on the insulation layer;
structuring the mask layer to provide the mask layer with a plurality of openings that define the location and size of the plurality of the at least one of the recesses and openings in the insulation layer;
etching the insulation layer using the mask layer as an etching mask to form the plurality of the at least one of the recesses and openings in the insulation layer.

3. The method of claim 2, wherein the etching is an isotropic etching.

4. The method of claim 2, wherein the etching is an anisotropic etching.

5. The method of claim 2, further comprising:
implanting dopants into the insulation layer using the mask layer as implantation mask.

6. The method of claim 1, wherein the insulation layer is an oxide layer.

7. The method of claim 1, wherein the insulation layer is a doped oxide layer.

8. The method of claim 1, wherein the tempering of the insulation layer is carried out at an elevated temperature in a temperature range between about 800° C. and about 1100° C.

9. The method of claim 1, wherein the insulation layer comprises a first insulation layer on the first surface of the substrate and a second insulation layer on the first insulation layer.

10. The method of claim 9, wherein the first insulation layer and the second insulation layer differ from each other at least in one of a vertical thickness and a material.

11. The method of claim 9, wherein the insulation layer further comprises an etch stop layer arranged between the first insulation layer and the second insulation layer.

12. The method of claim 11, further comprising:
forming a mask layer on the second insulation layer;
structuring the mask layer to provide the mask layer with a plurality of openings that define the location and size of the plurality of the at least one of the recesses and openings in the insulation layer;
etching the second insulation layer using the mask layer as etching mask to form openings in the second insulation layer that extends up to the etch stop layer, wherein the etching stops at the etch stop layer.

13. The method of claim 12, wherein the etch stop layer is comprised of a material different than a material of the second insulation layer, and wherein the etch stop layer is etched at a reduced etching rate during etching in comparison with the second insulation layer.

14. The method of claim 12, wherein the etch stop layer is comprised of a material that is etched at substantially the same etching rate as the second insulation layer during etching, the method further comprising:
monitoring the etching and detecting when the etching reaches the etch stop layer; and
stopping the etching when the etching reaches the etch stop layer.

15. The method of claim 12, wherein tempering the insulation layer comprises diffluencing the second insulation layer to provide the second insulation layer with a laterally varying thickness, the method further comprising:
etching the second insulation layer having a laterally varying thickness, the etch stop layer, and the first insulation layer, to provide the first insulation layer with a laterally varying thickness.

16. The method of claim 15, further comprising:
tempering the first insulation layer having a laterally varying thickness to partially diffluence the first insulation layer.

17. The method of claim 1, further comprising:
forming a metal layer on the insulation layer that has a laterally varying thickness.

18. The method of claim 1, further comprising at least one of:
increasing the pitch (p) of the plurality of the at least one of the recesses and openings in the lateral direction while the lateral width (w) of each of the at least one of the recesses and openings remains constant;
decreasing the lateral width (w) of each of the at least one of the recesses and openings in the lateral direction while the pitch (p) of the plurality of the at least one of the recesses and openings remains constant; and
decreasing the lateral width (w) of each of the at least one of the recesses and openings in the lateral direction while the pitch (p) of the plurality of the at least one of the recesses and openings increases in the lateral direction.

19. The method of claim 1, further comprising:
forming a mask layer on the insulation layer;
structuring the mask layer to provide the mask layer with a plurality of openings that define the location and size of the plurality of the at least one of the recesses and openings in the insulation layer;
implanting dopants into the insulation layer using the mask layer as implantation mask;
removing the mask layer after implantation; and
etching the insulation layer after removal of the mask layer.

20. The method of claim 1, the method further comprising:
implanting dopants in the substrate using the insulation layer with laterally varying thickness as implantation mask, wherein the substrate is a semiconductor substrate.

21. A method of manufacturing a semiconductor device, the method comprising:
providing a semiconductor substrate with a first surface;
forming an insulation layer on the first surface of the semiconductor substrate;

forming a plurality of at least one of recesses and openings in the insulation layer, the plurality of the at least one of the recesses and openings arranged at a pitch (p) and each of the at least one of the recesses and openings having a lateral width (w), wherein at least one of the pitch (p) and the lateral width (w) varies in lateral direction, and wherein the plurality of the at least one of the recesses and openings defines a given region of the insulation layer;

tempering the insulation layer comprising the plurality of the at least one of the recesses and openings at an elevated temperature so that the insulation layer diffluences to provide the insulation layer with a laterally increasing thickness at least in the given region; and forming a metal layer on the tempered insulation layer.

22. The method according to claim 21, further comprising:

forming a doping region in the semiconductor substrate at the first surface; and forming the metal layer such that it is in ohmic contact with the doping region.

23. The method according to claim 21, further comprising:

forming a first group of the at least one of the recesses and openings in a first region of the insulation layer;

forming a second group of the at least one of the recesses and openings in a second region of the insulation layer that is spaced apart from the first region; and tempering the insulation layer so that two separate regions with increasing thickness are formed in the insulation layer.

* * * * *